United States Patent
Ahmed et al.

(10) Patent No.: US 11,703,924 B2
(45) Date of Patent: Jul. 18, 2023

(54) SLOT AIRFLOW BASED ON A CONFIGURATION OF THE CHASSIS

(71) Applicant: DELL PRODUCTS, LP, Round Rock, TX (US)

(72) Inventors: Muhammad B. Ahmed, Austin, TX (US); Richard M. Eiland, Austin, TX (US); Douglas E. Messick, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 248 days.

(21) Appl. No.: 17/242,443

(22) Filed: Apr. 28, 2021

(65) Prior Publication Data

US 2022/0350383 A1    Nov. 3, 2022

(51) Int. Cl.
| | |
|---|---|
| *G06F 1/20* | (2006.01) |
| *G06F 9/4401* | (2018.01) |
| *G05B 13/02* | (2006.01) |
| *G06N 3/08* | (2023.01) |
| *G06N 3/04* | (2023.01) |
| *G06F 1/18* | (2006.01) |

(52) U.S. Cl.
CPC ........... *G06F 1/206* (2013.01); *G05B 13/027* (2013.01); *G06F 1/181* (2013.01); *G06F 9/4401* (2013.01); *G06N 3/04* (2013.01); *G06N 3/08* (2013.01)

(58) Field of Classification Search
CPC ..... G05B 13/027; G05B 19/418; G06F 1/181; G06F 1/206; G06F 9/4401; G06N 20/00; G06N 3/04; G06N 3/08
See application file for complete search history.

(56) References Cited

U.S. PATENT DOCUMENTS

| | | |
|---|---|---|
| 10,271,455 B2 | 4/2019 | Cho et al. |
| 10,334,753 B2 * | 6/2019 | Chu .................. H05K 7/20145 |
| 2015/0192937 A1 * | 7/2015 | Govindarajan ........ G05B 15/02 700/275 |

* cited by examiner

*Primary Examiner* — Terrell S Johnson
(74) *Attorney, Agent, or Firm* — Larson Newman, LLP

(57) ABSTRACT

An information handling system includes a chassis having multiples sleds and an embedded controller. The embedded controller retrieves relative impedances for all of the sleds, and calculates a maximum available airflow for the first sled based the relative impedances of all other sleds. A baseboard management controller (BMC) of a first sled requests a boot operation for the first sled. The BMC collects configuration information for the first sled, and determines an airflow impedance of the first sled based on the configuration information. The BMC provides the airflow impedance and a power allocation request to the embedded controller. The BMC compares the maximum available airflow to a minimum airflow requirement for the first sled. If the maximum available airflow is less than the minimum airflow requirement, the BMC implements power limits for processors in the first sled to prevent overheating of components within the first sled.

20 Claims, 6 Drawing Sheets

SLOT AIRFLOW BASED ON A CONFIGURATION OF THE CHASSIS

FIELD OF THE DISCLOSURE

The present disclosure generally relates to information handling systems, and more particularly relates to airflow in each slot based on a configuration of the chassis.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus, information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

An information handling system includes a chassis having multiples sleds and an embedded controller. The embedded controller may retrieve relative impedances for all of the sleds, and calculate, via a machine learning system, a maximum available airflow for the first sled based on an impedance of the sled and based on the relative impedances of all other sleds. A baseboard management controller (BMC) of a first sled may request a boot operation for the first sled. The BMC may collect configuration information for the first sled, and determine an airflow impedance of the first sled based on the configuration information. The BMC may provide the airflow impedance and a power allocation request to the embedded controller. The BMC may compare the maximum available airflow to a minimum airflow requirement for the first sled. If the maximum available airflow is less than the minimum airflow requirement, the BMC may implement power limits for processors in the sled to prevent overheating of components within the sled.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings and is provided to assist in describing the teachings. This focus should not be interpreted as a limitation on the scope or applicability of the teachings.

Figure 1:
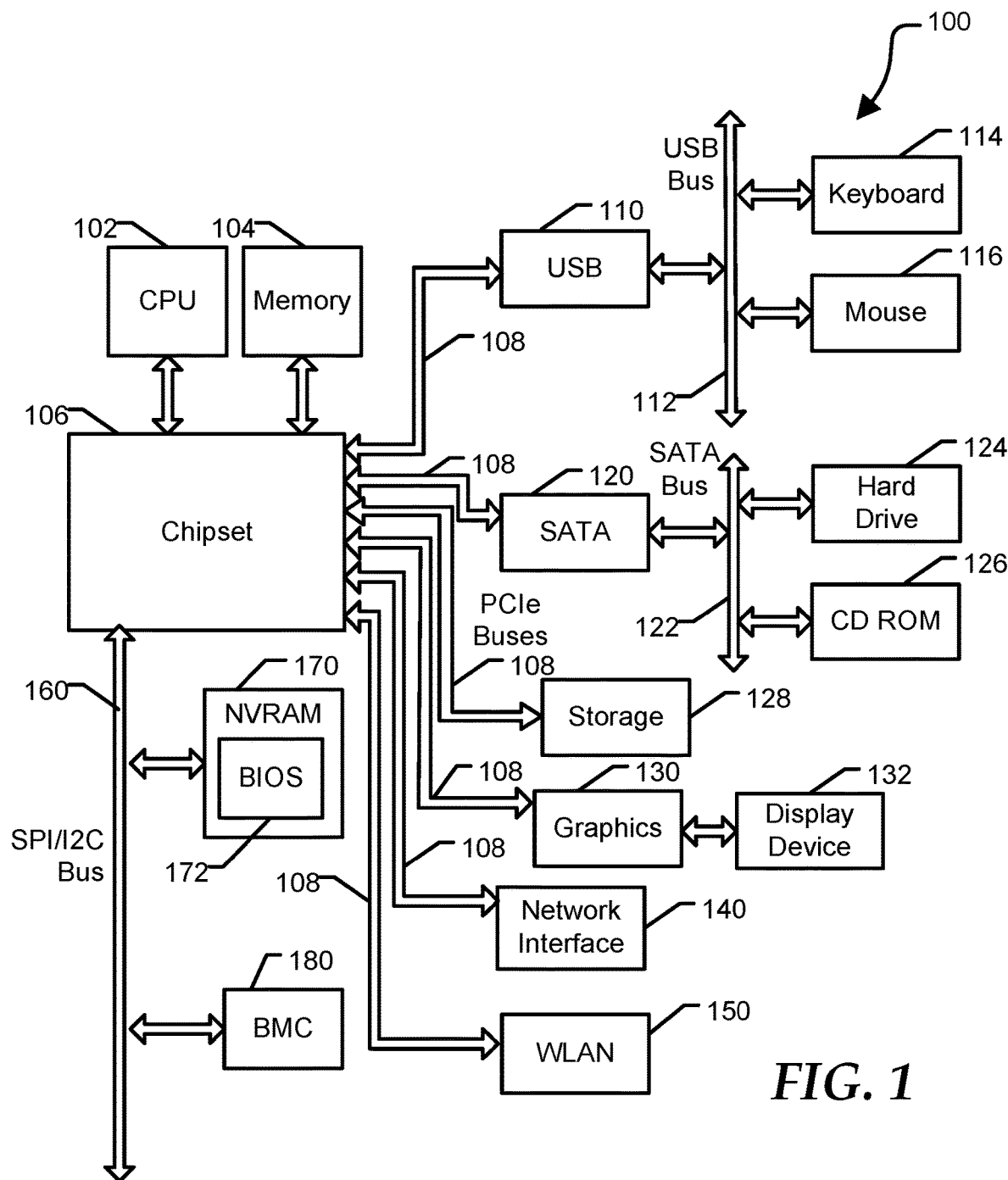
FIG. 1 is a block diagram of a general information handling system according to at least one embodiment of the present disclosure.

FIG. 1 illustrates a general information handling system 100. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network server or storage device, a switch router or other network communication device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various other I/O devices, such as a keyboard, a mouse, and a video display. The information handling system may also include one or more busses operable to transmit communications between the various hardware components.

Information handling system 100 including a processor 102, a memory 104, a chipset 106, one or more PCIe buses 108, a universal serial bus (USB) controller 110, a USB bus 112, a keyboard device controller 114, a mouse device controller 116, a configuration a SATA bus controller 120, a SATA bus 122, a hard drive device controller 124, a compact disk read only memory (CD ROM) device controller 126, a storage 128, a graphics device controller 130, a network interface controller (NIC) 140, a wireless local area network (WLAN) or wireless wide area network (WWAN) controller 150, a serial peripheral interface (SPI) bus 160, a NVRAM 170 for storing BIOS 172, and a baseboard management controller (BMC) 180. In an example, chipset 106 may be directly connected to an individual end point via a PCIe root port within the chipset and a point-to-point topology as shown in FIG. 1. BMC 180 can be referred to as a service processor or embedded controller (EC). Capabilities and functions provided by BMC 180 can vary considerably based on the type of information handling system. For example, the term baseboard management system is often used to describe an embedded processor included at a server, while an embedded controller is more likely to be found in a consumer-level device. As disclosed herein, BMC 180 represents a processing device different from CPU 102, which provides various management functions for information handling system 100. For example, an embedded controller may be responsible for power management, cooling management, and the like. An embedded controller included at a data storage system can be referred to as a storage enclosure processor.

System 100 can include additional processors that are configured to provide localized or specific control functions, such as a battery management controller. Bus 160 can include one or more busses, including a SPI bus, an I2C bus, a system management bus (SMBUS), a power management bus (PMBUS), and the like. BMC 180 can be configured to provide out-of-band access to devices at information handling system 100. As used herein, out-of-band access herein refers to operations performed prior to execution of BIOS 172 by processor 102 to initialize operation of system 100.

BIOS 172 can be referred to as a firmware image, and the term BIOS is herein used interchangeably with the term firmware image, or simply firmware. BIOS 172 includes instructions executable by CPU 102 to initialize and test the hardware components of system 100, and to load a boot loader or an operating system (OS) from a mass storage device. BIOS 172 additionally provides an abstraction layer for the hardware, such as a consistent way for application programs and operating systems to interact with the keyboard, display, and other input/output devices. When power is first applied to information handling system 100, the system begins a sequence of initialization procedures. During the initialization sequence, also referred to as a boot sequence, components of system 100 are configured and enabled for operation, and device drivers can be installed. Device drivers provide an interface through which other components of the system 100 can communicate with a corresponding device.

Information handling system 100 can include additional components and additional busses, not shown for clarity. For example, system 100 can include multiple processor cores, audio devices, and the like. While a particular arrangement of bus technologies and interconnections is illustrated for the purpose of example, one of skill will appreciate that the techniques disclosed herein are applicable to other system architectures. System 100 can include multiple CPUs and redundant bus controllers. One or more components can be integrated together. For example, portions of chipset 106 can be integrated within CPU 102. Additional components of information handling system 100 can include one or more storage devices that can store machine-executable code, one or more communications ports for communicating with external devices, and various input and output (I/O) devices, such as a keyboard, a mouse, and a video display. An example of information handling system 100 includes a multi-tenant chassis system where groups of tenants (users) share a common chassis, and each of the tenants has a unique set of resources assigned to them. The resources can include blade servers of the chassis, input/output (I/O) modules, Peripheral Component Interconnect-Express (PCIe) cards, storage controllers, and the like.

Figure 2:
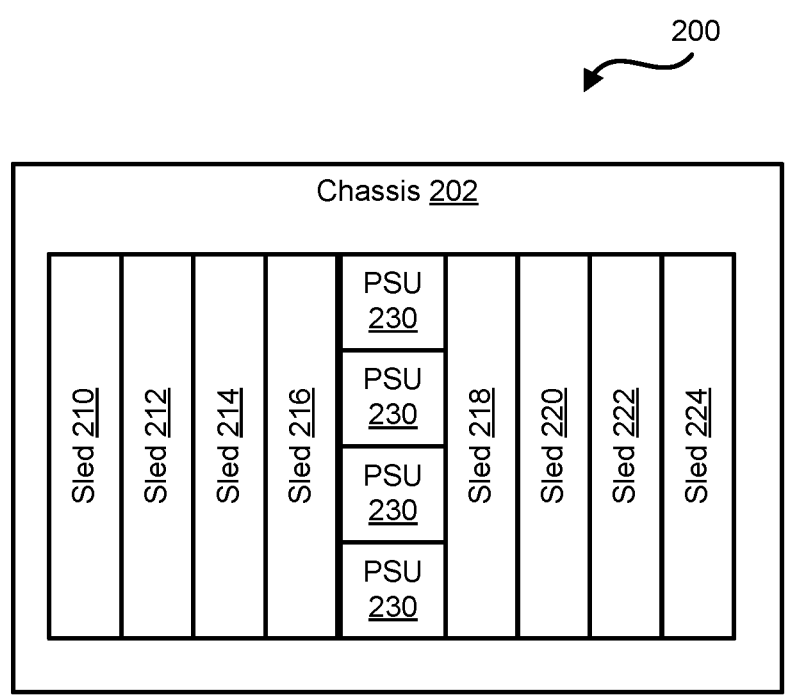
FIG. 2 is a diagram of an information handling system with multiple sleds according to at least one embodiment of the disclosure.

In an example, information handling system 100 may be any suitable device including, but not limited to, sleds 202, 204, 206, 208, 210, 212, 214, and 216 of FIG. 2. Information handling system 100 can include a set of instructions that can be executed to cause the information handling system to perform any one or more of the methods or computer-based functions disclosed herein. The information handling system 100 may operate as a standalone device or may be connected to other computer systems or peripheral devices, such as by a network.

In a networked deployment, the information handling system 100 may operate in the capacity of a server or as a client user computer in a server-client user network environment, or as a peer computer system in a peer-to-peer (or distributed) network environment. The information handling system 100 can also be implemented as or incorporated into various devices, such as a personal computer (PC), a tablet PC, a set-top box (STB), a personal digital assistant (PDA), a mobile device, a palmtop computer, a laptop computer, a desktop computer, a communications device, a wireless telephone, a land-line telephone, a control system, a camera, a scanner, a facsimile machine, a printer, a pager, a personal trusted device, a web appliance, a network router, switch or bridge, or any other machine capable of executing a set of instructions (sequential or otherwise) that specify actions to be taken by that machine. In a particular embodiment, the computer system 100 can be implemented using electronic devices that provide voice, video, or data communication. Further, while a single information handling system 100 is illustrated, the term "system" shall also be taken to include any collection of systems or sub-systems that individually or jointly execute a set, or multiple sets, of instructions to perform one or more computer functions.

FIG. 2 illustrates an information handling system 200 according to at least one embodiment of the disclosure. Information handling system 200 includes a chassis 202, multiple sleds 210, 212, 214, 216, 218, 220, 222, and 224 (sleds 210-224), and multiple power supply units (PSUs) 230. Sleds 210-224 may be any suitable component within a slot of chassis 202. For example, a sled may be a single wide sled, a double wide sled, a blank sled, or the like. PSUs 230 may provide power to each of sleds 210-224. In an example, information handling system 200 may include additional components over those shown in FIG. 2 without varying from the scope of this disclosure.

An amount of cooling airflow for each of sleds 210-224 may be based on an amount of power consumed by processors within the sled. For example, one of sleds 210-224 may include multiple processors rated between two hundred and three hundred Watts, which may need more cooling airflow than another sled that only includes fifty to one-hundred Watts processors. In an example, sleds 210-224 may include different airflow impedances. In certain examples, an airflow impedance of a particular sled of sleds 210-224 may be based on any suitable number of factors including, but not limited to, the components included within the sled. For example, sled 210 may include a particular number of hard drives, and sled 212 may include lower number of hard drives. In this example, sled 210 may have a higher airflow impedance as compared to sled 212 based on the higher number of hard drives in sled 210 blocking a larger amount of airflow as compared to sled 212. Sled 210 may receive a lesser amount of airflow based both on the airflow impedance of sled 210 and the airflow impedance of the adjacent sled 212.

In certain examples, CPU thermal design power or point (TDP) may be a maximum amount of heat generated by CPUs that a cooling system is designed to dissipate under any workload. In an example, a maximum CPU TDP may be defined based on a worst case mixing of sled impedances. A worst case mixing of sled impedance may be any differences in airflow impedances including, but not limited to, sled 210 having a high-impedance and remaining sleds 212-224 having a low-impedance. In previous information handling systems, CPU TDP of the sleds in a chassis always may be set for a worst-case impedance levels without actual chassis configuration being determined. Information handling system 200 may be improved by the chassis configuration being utilized to set CPU TDP for each sled of chassis 202. In an example, information handling system 200 may also be improved by utilizing and enforcing a more uniform sled airflow impendence in chassis 202 both before and after the point of sale.

Figure 3:
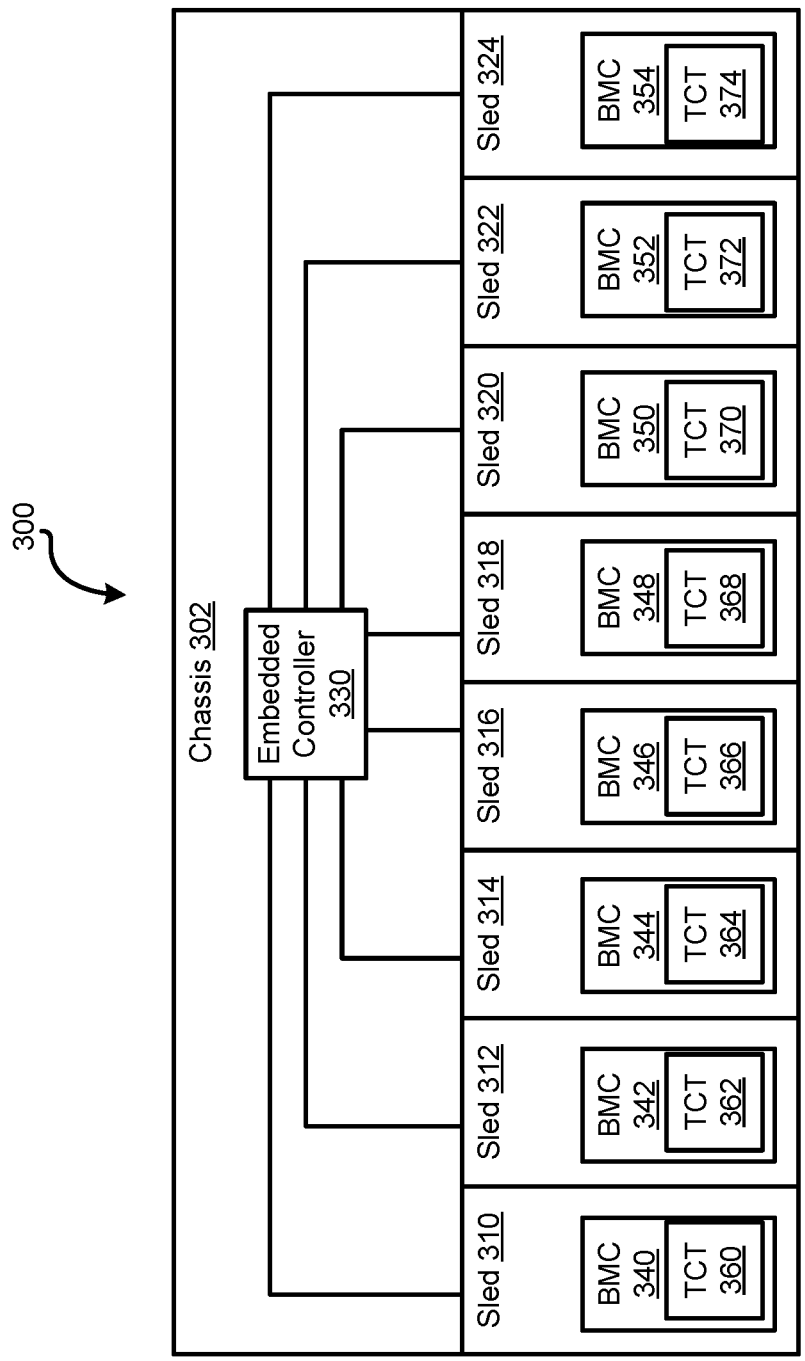
FIG. 3 is a block diagram of the information handling system according to at least one embodiment of the disclosure.

FIG. 3 illustrates a portion of an information handling system 300 including a chassis 302, multiple sleds 310, 312, 314, 316, 318, 320, 322, and 324 (sleds 310-324), and an embedded controller 330 according to at least one embodiment of the disclosure. Each sled 310-324 may communicate with embedded controller 300. Each of sleds 310-324 includes a respective baseboard management controller (BMC) 340, 342, 344, 346, 348, 350, 352, and 354 (BMCs 340-352), and respective thermal control tables (TCT) 360, 362, 364, 366, 368, 370, 372, and 374. In an example, sleds 310 may include any additional hardware devices including, but not limited to, a CPU, one or more dual inline memory modules (DIMMs), network interface cards (NICs), hard disk drives (HDDs), and solid-state drives (SSDs). In certain examples, BMC may be a commercially available BMC product or other device that operates in accordance with an Intelligent Platform Management Initiative (IPMI) specification, a Web Services Management (WSMan) interface, a Redfish Application Programming Interface (API), another Distributed Management Task Force (DMTF), or other management standard, and can include an Integrated Dell Remote Access Controller (iDRAC), an Embedded Controller (EC), or the like. In an example, each BMC 340-354 may store any suitable data within a respective memory of the BMC including, but not limited to, respective TCT 360-374. In certain examples, information handling system 300 may include additional components over those shown in FIG. 3 without varying from the scope of this disclosure.

In an example, an individual may purchase a sled, such as sled 310, with specific components. For example, the components of sled 310 may include, but is not limited to, CPUs with certain power capacities, and a particular number of hard disk drives (HDDs) in the backplane of the sled. The power capacities of the CPUs may be 275 W, 300 W, or the like. The number of HDDs may be two, four, eight, or the like. In an example, at the point of sale for sled 310, the individual may be notified that the configuration of the sled requires a homogenous population of sleds in chassis 302 so that sleds 310-324 may run at full performance. The requirement for a homogenous population of sleds in chassis 302 may be based on any suitable characteristics of the sled including, but not limited to, the power usage of the CPUs, and the number of HDDs in the sled. For example, CPUs with 275 W power usage may require airflow of 55 cubic feet per minute (CFM) for proper cooling, and CPUs with 300 W power usage may need airflow of 56 CFM for propose cooling. In these examples, chassis 302 may only be able to provide these levels of airflow when the chassis has a homogenous population of airflow impedance among sleds 310-324. During the point of sale, the individual is notified of configuration requirements for chassis 302 to enable sleds 310-324 to optimally perform.

After the point of sale, the individual may insert a new sled 310 into chassis 302, or a new individual may own or operate chassis 302. In this example, EC 330 and BMCs 340-354 may communicate to determine the airflow available to each sled 310-324. Each BMC 340-354 may perform one or more operations to determine whether the available airflow is sufficient for the respective sled 340-354. For example, each BMC 340-354 may utilize the information associated with the available airflow and data within respective TCT 360-374 to determine if the available airflow meets the needs of respective sled 340-354. In an example, EC 330 may determine a restriction matrix for chassis 302 that represents an actual population of the chassis and not a worst-case scenario of sled populations.

The operations of EC 330 and BMCs 340-354 may improve information handling system 300 by warning an individual if an available airflow is insufficient for one or more sleds 310-324. This is an improvement over previous information handling system, which may throttle CPUs in one or more sleds to prevent overheating of the sleds without the individual knowing why the throttling was performed.

In an example, any BMC 340-354 may request a boot operation for the corresponding sled 340-354, which in turn may initiate one or more operations in EC 330 and all BMCs. For brevity and clarity, operations herein will be described with respect to BMC 340 of sled 310 and EC 330, but may be performed by any BMC within chassis 302. For example, BMC 340 may request a boot operation for sled or server 310. Based on the boot operation request, BMC 340 may collect configuration information for sled 310 from any suitable source. In an example, the source of the configuration information may include, but is not limited to, BMC 340 polling all components within sled 310 to determine characteristics for the components, BMC retrieving system inventory data from any suitable memory, and BMC retrieving data from TCT 360. Based on the configuration information for sled 310, BMC 340 may determine an airflow impedance for the sled based on determined platform airflow characterizations in the system inventory data. For example, during POST, BMC 304 may match the system inventory of components in sled 310 to a characterized impedance level table to determine the relative sled impedance. BMC 340 may provide a power allocation request and the airflow impedance for sled 310 to EC 330. In an example, the power allocation request may include a request to boot sled 310 to an operating system.

In response to receiving the power allocation request and the airflow impedance of sled 310, EC 330 may perform one or more suitable operations to calculate a maximum airflow for each sled or slot 310-324. EC 330 may communicate with all BMCs 340-354 to retrieve the airflow impedance for respective sleds 310-324. In certain examples, EC 330 may utilize the received airflow impedance in a machine learning system, such as machine learning system 400 of FIG. 4, to calculate the maximum airflow available to each sled 310-324.

Figure 4:
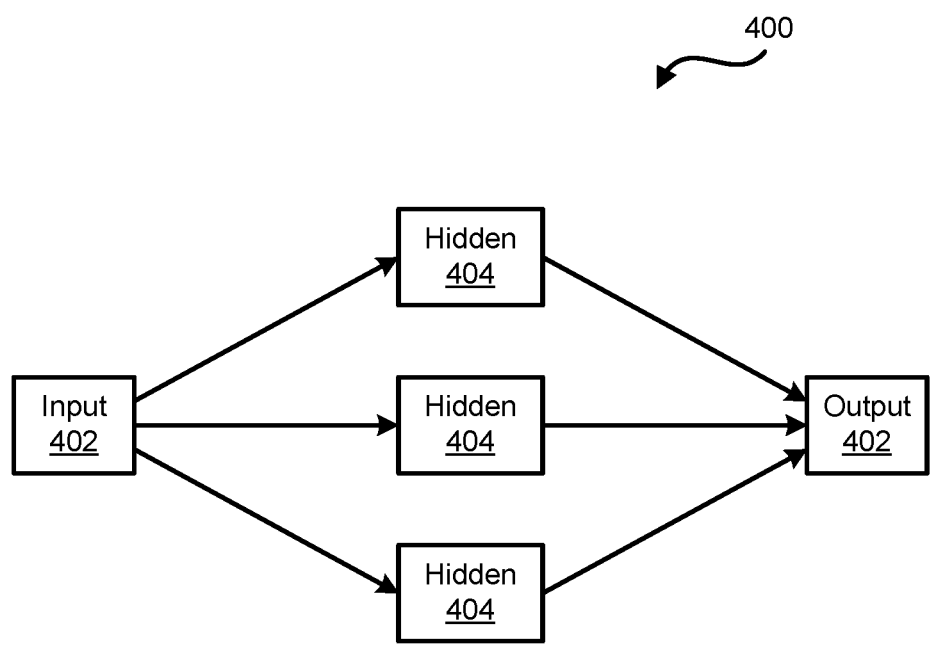
FIG. 4 is a block diagram of a machine learning system according to at least one embodiment of the disclosure.

FIG. 4 illustrates a machine learning system 400 according to at least one embodiment of the disclosure. Machine learning system 400 includes an input layer 402, one or more hidden layers 404, and an output layer 406. Input layer 402 may receive any suitable data associated with the airflow impedances of sled 310-324 and provide associated relative impedances for the sleds to hidden layers 404. In an example, airflow impedance may be a primary sled attribute that is utilized as an input data to input layer 402 of machine learning system 400. Hidden layers 404 may perform one or more operations on the input data, such as the relative impedances of sleds 310-324, and determine a different airflow equation for each of the sleds. The airflow equations for sleds 310-324 may be provided by output layer 406.

During training of machine learning system 400, a design-of-experiment (DOE) test plan may be utilized. In the DOE approach, each sled 310-324 may be provided with one of a set of relative impedances. For example, the relative impedances may be any suitable value including, but not limited to, 0, 1, 2, 3, and 4. In this example, a slot with a blank inserted as the sled may have a relative impedance of 4 or any corresponding highest impedance value. In an example, the lowest value for the relative impedances may represent the highest airflow impedance without varying from the scope of the disclosure.

In the training mode of machine learning system 400, any suitable number of DOEs may be generated and each DOE may include a different arrangement of relative impedances for sleds 310-324 as data for input layer 402. Hidden layers 404 may perform one or more operations to calculate an airflow equation for a particular sled, such as sled 310. In an example, the airflow equation for the particular sled may be provided by output layer 406. In an example, the training of hidden layers 404 may be performed in any suitable manner including, but not limited to, supervised learning, unsupervised learning, reinforcement learning, and self-learning. For example, if hidden layers 404 are trained via supervised learning, an individual may provide measured airflow data for each sled 310-324 while the relative impedances of the sleds are in each configuration of the DOEs. In this example, hidden layers 404 may utilize the receive airflow data to determine an airflow equation for each sled. In an example, any machine learning model may be utilized for determining the airflow equations including, but not limited to, a linear regression model.

During execution of machine learning system 400, input layer 402 may receive the impedances of sleds 310-324 and provide the impedances to hidden layers 404 in any suitable manner. For example, input layer 402 may convert the impedances into relative impedance values, may provide the impedance values as received from BMCs 340-354, or the like. Hidden layers 404 may then apply the received impedance levels for sleds 310-324 to the training data, which may provide an airflow equation for sled 310. The airflow equation for sled 310 may be provided to EC 330 via output layer 406. Machine learning system 400 may then perform the same operations to determine airflow equations for each sled 310-324 of chassis 302, and these equations may be provided by output layer 406.

In an example, the airflow equations may be any suitable equation including, but not limited to, linear regression equations. An exemplary linear regression equation for sled 310 is as follows: Sled 310 CFM=−16.7*Sled310+3.0*Sled312+2.0*Sled314+1.8*Sled316+0.5*Sled318+0.4*Sled320+0.4*Sled322+0.1*Sled324+81.5. In this exemplary linear regression equation, Sled310, Sled312, Sled314, Sled316, Sled318, Sled320, Sled322, and Sled324 are the relative impedances level of the corresponding sled. As illustrated in the equation above, a weight of the relative impedances decreases as a distance of a sled increases from sled 310.

Referring back to FIG. 3, EC 330 may utilize the airflow equations to determine a maximum airflow, in CFM, for each sled 310-324. EC 330 may then provide the maximum airflow for each sled 310-324 to the respective BMC 340-354.

In response to receiving the maximum airflow for sled 310, BMC 340 perform one or more operations to determine whether the available airflow is sufficient. For example, BMC 340 may compare the received maximum airflow to data in TCT 360. In an example, TCT 360 may include or define a minimum airflow in CFMs need per CPU TDP of sled 310. If the maximum airflow value received from EC 330 is greater than the minimum airflow value in TCT 360, BMC 340 may determine that the available airflow is sufficient and may the components of sled 310 to perform normal operations. If the maximum airflow value received from EC 330 is less than the minimum airflow value in TCT 360, BMC 340 may determine that the guaranteed maximum available airflow is insufficient.

In response to the received maximum airflow value being less than the airflow value in TCT 360, BMC 340 may perform one or more operations to prevent components in sled 310 from overheating and to provide warnings to an individual associated with chassis 302. In an example, BMC 340 may provide thermal control limits on the components of sled 310. For example, BMC 340 may throttle CPUs within sled 310 to prevent overheating. In an example, BMC 340 also may provide warnings to an individual associated with the sled. For example, BMC 340 may provide a notification message indicating that sled 310 has power limits to prevent overheating. The message may be any suitable type of message including, but not limited to, an audio message and a visual message.

In an example, any BMC 340-354 and EC 330 may provide real-time airflow of respective sleds 310-324 to an individual associated with the sleds. Similarly, EC 330 may provide real-time airflow for chassis 302 to the individual. In certain examples, the data generated for maximum available airflow to each sled 310-324 may be provided during a point of sale to help individuals size a data center airflow capacity for chassis 302.

As stated above, EC 330 and BMCs 340-354 perform any suitable operations to determine if a maximum airflow available to each of sleds 310-324 may provide enough cooling for the sled, but not a best cooling configuration. In certain examples, EC 330 may perform the operations described above with respect to BMC 340 without varying from the scope of this disclosure. In an example, characterizations of chassis 300 may be performed at any suitable fan speed, such as fan speeds less than 100% PWM. In this example, the generated airflow equations to predict sled slot airflow may be developed as a function of system fan speeds.

Figure 5:
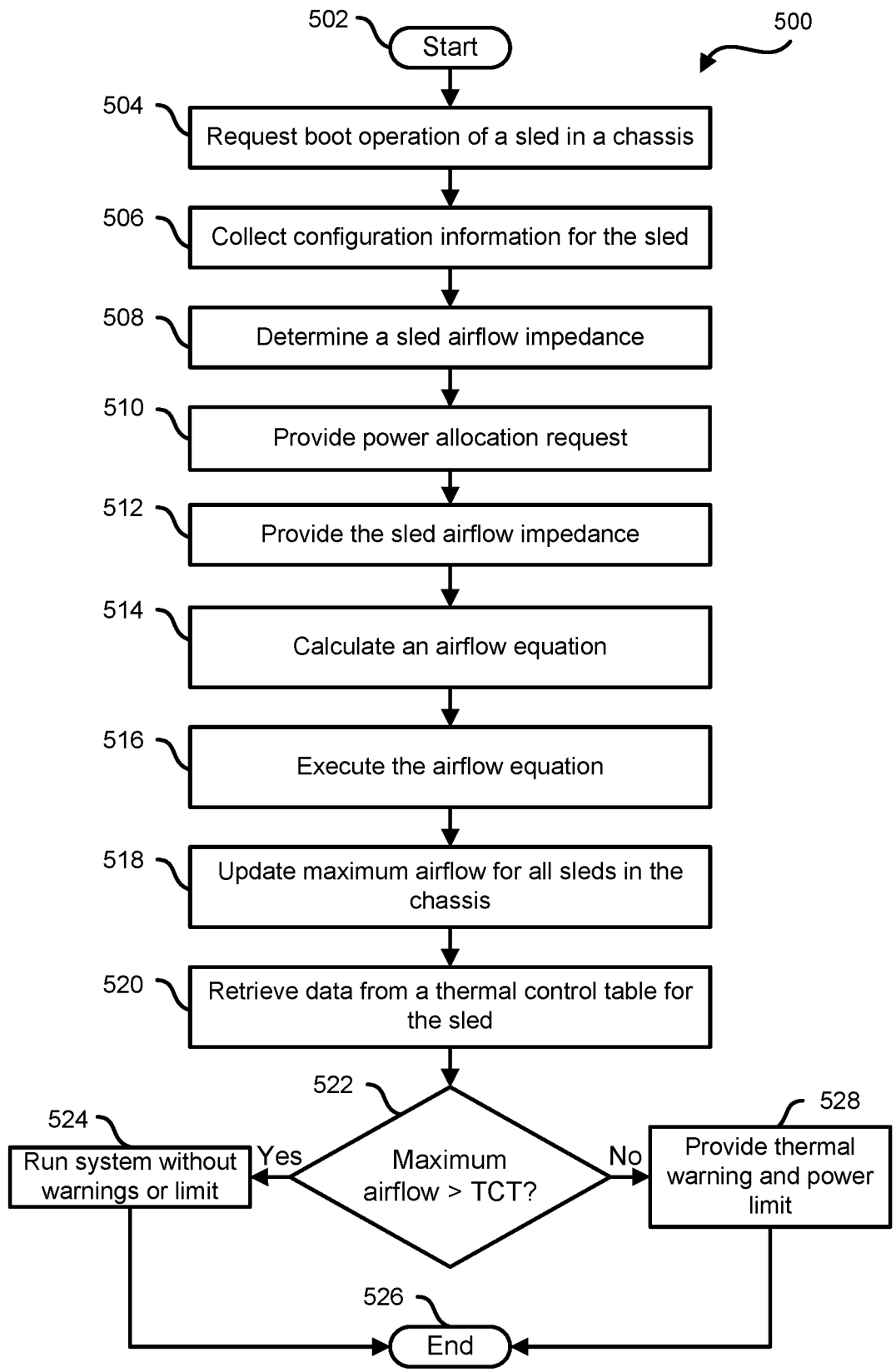
FIG. 5 is a flow diagram of a method for determining a maximum airflow for each sled of an information handling system according to at least one embodiment of the disclosure.

FIG. 5 is a flow diagram of a method 500 for determining a maximum airflow for each sled of an information handling system according to at least one embodiment of the disclosure, starting at block 502. It will be readily appreciated that not every method step set forth in this flow diagram is always necessary, and that certain steps of the methods may be combined, performed simultaneously, in a different order, or perhaps omitted, without varying from the scope of the disclosure. FIG. 5 may be employed in whole, or in part, by information handling system 100 depicted in FIG. 1, information handling system 300 depicted in FIG. 3, or any other type of system, controller, device, module, processor, or any combination thereof, operable to employ all, or portions of, the method of FIG. 5.

At block 504, a boot operation of a sled is requested. In an example, a BMC of a sled may request the boot operation. In certain examples, the sled may be any suitable sled within a chassis of the information handling system. For example, the sled maybe a sled that is newly added to the chassis. At block 506, configuration information for the sled is collected. In an example, the source of the configuration information may include, but is not limited to, the BMC polling all components within sled to determine characteristics for the components, the BMC retrieving system inventory data from any suitable memory, and BMC retrieving data from a TCT. At block 508, a sled airflow impedance is determined. In an example, the BMC may utilize the configuration information for the sled to determine an airflow impedance for the sled based on determined platform airflow characterizations in the system inventory data. For example, during POST, the BMC may match the system inventory of components in the sled to a characterized impedance level table to determine the relative sled impedance. At block 510, a power allocation request is provided.

At block 512, the sled airflow impedance is provided. In an example, the BMC may provide the power allocated to an EC of the chassis along with the relative sled impedance. At block 514, an airflow equation is calculated. In an example, the airflow equation may be calculated by any suitable manner including, but not limited to, a machine learning system. The airflow equation may be any suitable equation including, but not limited to, a linear regression equation. At block 516, the airflow equation is executed. In an example, the execution of the airflow equation made calculate a maximum airflow available for a sled. At block 518, a maximum airflow is updated for all sleds in the chassis. At block 520, data from a TCT is retrieved for the sled. In an example, the data may include a minimum amount of airflow to cool the components of the sled.

At block 522, a determination is made whether the maximum airflow is greater than the TCT. If the maximum airflow is greater than the TCT, the system is run without warnings or limit at block 524, and the flow ends at block 526. If the maximum airflow is less than the TCT, thermal warnings and power limits are provided at block 528, and the flow ends at block 526. For example, the BMC may provide a notification message indicating that the sled has power limits to prevent overheating. The message may be any suitable type of message including, but not limited to, an audio message and a visual message.

Figure 6:
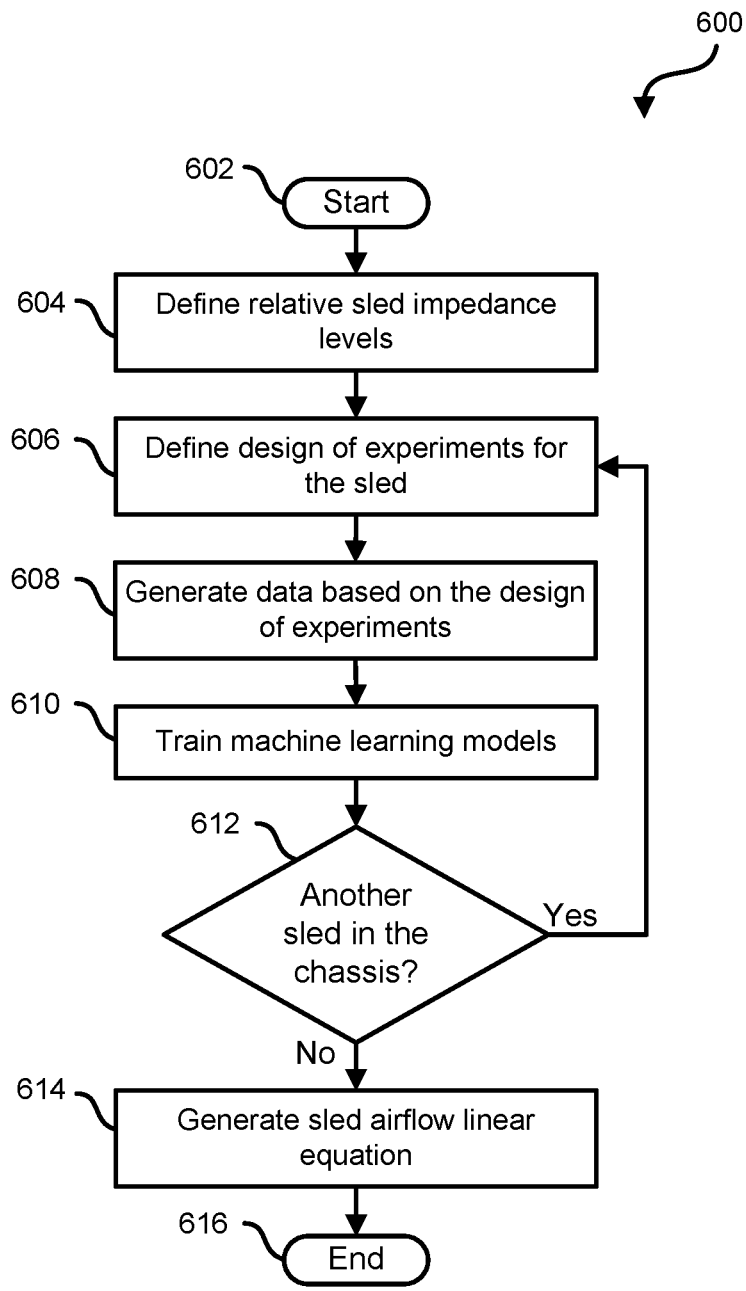
FIG. 6 is a flow diagram of a method for determining an airflow equation for airflow in each sled of an information handling system according to at least one embodiment of the current disclosure.

FIG. 6 is a flow diagram of a method 600 for determining an airflow equation for airflow in each sled of an information handling system according to at least one embodiment of the current disclosure, starting at block 602. It will be readily appreciated that not every method step set forth in this flow diagram is always necessary, and that certain steps of the methods may be combined, performed simultaneously, in a different order, or perhaps omitted, without varying from the scope of the disclosure. FIG. 6 may be employed in whole, or in part, by information handling system 100 depicted in FIG. 1, information handling system 200 depicted in FIG. 2, or any other type of system, controller, device, module, processor, or any combination thereof, operable to employ all, or portions of, the method of FIG. 6.

At block 604, relative sled impedance levels are defined. In an example, each sled may be provided with one of a set of relative impedances. For example, the relative impedances may be any suitable value including, but not limited to, 0, 1, 2, 3, and 4. In an example, the relative sled impedance levels may be determined by BMCs associated with the sleds of a chassis. At block 606, designs of experiments (DOEs) are defined for the sled. At block 608, data is generated based on the experiments. In an example, the generated data may be utilized to train a machine learning system.

At block 610, machine learning models are trained. In the training mode of machine learning system, any suitable number of DOEs may be generated and each DOE may include a different arrangement of relative impedances for each sled in a chassis. In an example, the training may be performed in any suitable manner including, but not limited to, supervised learning, unsupervised learning, reinforcement learning, and self-learning. In certain examples, the training may be performed on a sled-by-sled basis. At block 612, a determination is made whether another sled is in the chassis. If another sled is in the chassis, the flow continues as described above at block 606. If another sled is not located in the chassis, a sled airflow equation is generated at block 614, and the flow ends at block 616.

Referring back to FIG. 1, the information handling system 100 can include a disk drive unit and may include a computer-readable medium, not shown in FIG. 1, in which one or more sets of instructions, such as software, can be embedded. Further, the instructions may embody one or more of the methods or logic as described herein. In a particular embodiment, the instructions may reside completely, or at least partially, within system memory 104 or another memory included at system 100, and/or within the processor 102 during execution by the information handling system 100. The system memory 104 and the processor 102 also may include computer-readable media.

While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding, or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories. Further, the computer-readable medium can be a random-access memory or other volatile re-writable memory. Additionally, the computer-readable medium can include a magneto-optical or optical medium, such as a disk or tapes or other storage device to store information received via carrier wave signals such as a signal communicated over a transmission medium. Furthermore, a computer readable medium can store information received from distributed network resources such as from a cloud-based environment. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

When referred to as a "device," a "module," or the like, the embodiments described herein can be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCMCIA) card, or other such expansion card), or a system (such as a motherboard, a system-on-a-chip (SoC), or a stand-alone device).

The device or module can include software, including firmware embedded at a processor or software capable of operating a relevant environment of the information handling system. The device or module can also include a combination of the foregoing examples of hardware or software. Note that an information handling system can include an integrated circuit or a board-level product having portions thereof that can also be any combination of hardware and software.

Devices, modules, resources, or programs that are in communication with one another need not be in continuous communication with each other, unless expressly specified otherwise. In addition, devices, modules, resources, or programs that are in communication with one another can communicate directly or indirectly through one or more intermediaries.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. A chassis for an information handling system, the chassis comprising:
    a plurality of sleds including a first sled; and
    an embedded controller to communicate with each of the sleds, the embedded controller to:
        retrieve relative impedances for all of the sleds; and
        calculate, via a machine learning system, a maximum available airflow for the first sled based on an impedance of the sled and based on the relative impedances of all other sleds;
    wherein the first sled includes a baseboard management controller, the baseboard management controller to:
        request a boot operation for the first sled;
        collect configuration information for the first sled;
        determine an airflow impedance of the first sled based on the configuration information;
        provide the airflow impedance and a power allocation request to the embedded controller;
        compare the maximum available airflow to a minimum airflow requirement for the first sled; and
        if the maximum available airflow is less than the minimum airflow requirement, then implement power limits for processors in the first sled to prevent overheating of components within the first sled.

2. The chassis of claim 1, wherein the baseboard management controller further to provide a message indicating that the power limits are implemented based on the maximum available airflow being less than the minimum airflow requirement for the first sled.

3. The chassis of claim 1, wherein the calculation of the maximum available airflow, the machine learning system of the embedded controller further to calculate an airflow equation for the maximum available airflow for the first sled, wherein the airflow equation is calculated in one or more hidden layers of the machine learning system.

4. The chassis of claim 3, wherein the airflow equation is a linear regression equation.

5. The chassis of claim 3, wherein the airflow equation includes different weights for relative impedances of all of the sleds in the chassis.

6. The chassis of claim 1, wherein the baseboard management controller further to determine the minimum airflow requirement based on thermal design point for the processors in the first sled.

7. The chassis of claim 1, wherein the embedded controller further to generate multiple design of experiments, wherein each of the design of experiments includes a different relative impedance for all of the sleds in the chassis, and to train the machine learning system based on the multiple design of experiments.

8. The chassis of claim 7, wherein the configuration information includes a power rating for processor of the sled and a number of hard disk drives in the first sled.

9. A method comprising:
    collecting, by a baseboard management controller of a sled, configuration information for the sled, wherein the sled is one of a plurality of sleds within a chassis of an information handling system;
    determining an airflow impedance of the sled based on the configuration information;
    providing the airflow impedance to an embedded controller of the chassis;
    retrieving, by the embedded controller, relative impedances for all of the sleds in the chassis;
    calculating, by a machine learning system, a maximum available airflow for the sled based on the relative impedance of the sled and based on the impedances of all other sleds in the chassis;
    comparing, by the baseboard management controller, the maximum available airflow to a minimum airflow requirement for the sled; and
    if the maximum available airflow is less than the minimum airflow requirement, then implementing power limits for processors in the sled to prevent overheating of components within the sled.

10. The method of claim 9, further comprising:
    providing a message indicating that the power limits are implemented based on the maximum available airflow being less than the minimum airflow requirement for the sled.

11. The method of claim 9, wherein the calculating of the maximum available airflow further comprises:
    calculating, by the machine learning system, an airflow equation for the maximum available airflow for the sled, wherein the airflow equation is calculated in one or more hidden layers of the machine learning system.

12. The method of claim 11, wherein the airflow equation is a linear regression equation.

13. The method of claim 11, wherein the airflow equation includes different weights for relative impedances of all of the sleds in the chassis.

14. The method of claim 9, further comprising:
    determining the minimum airflow requirement based on thermal design point for the processors in the sled.

15. The method of claim 9, further comprising:
    generating multiple design of experiments, wherein each of the design of experiments includes a different relative impedance for all of the sleds in the chassis; and
    training the machine learning system based on the multiple design of experiments.

16. The method of claim 9, wherein the configuration information includes a power rating for processor of the sled and a number of hard disk drives in the sled.

17. A method comprising:
- requesting, by a baseboard management controller of a sled, a boot operation for the sled, wherein the sled is one of a plurality of sleds within a chassis of an information handling system;
- collecting configuration information for the sled;
- determining an airflow impedance of the sled based on the configuration information;
- providing the airflow impedance and a power allocation request to an embedded controller of the chassis;
- retrieving, by the embedded controller, relative impedances for all of the sleds in the chassis;
- calculating, by a machine learning system, a maximum available airflow for the sled based on the relative impedance of the sled and based on the impedances of all other sleds in the chassis;
- comparing, by the baseboard management controller, the maximum available airflow to a minimum airflow requirement for the sled; and
- if the maximum available airflow is less than the minimum airflow requirement, then implementing power limits for processors in the sled to prevent overheating of components within the sled.

18. The method of claim 17, wherein the calculating of the maximum available airflow further comprises:
- calculating, by the machine learning system, an airflow equation for the maximum available airflow for the sled, wherein the airflow equation is calculated in one or more hidden layers of the machine learning system.

19. The method of claim 17, further comprising:
- generating multiple design of experiments, wherein each of the design of experiments includes a different relative impedance for all of the sleds in the chassis; and
- training the machine learning system based on the multiple design of experiments.

20. The method of claim 17, further comprising:
- determining the minimum airflow requirement based on thermal design point for the processors in the sled.

* * * * *